US012660427B2

(12) United States Patent
Chen et al.

(10) Patent No.: US 12,660,427 B2
(45) Date of Patent: Jun. 16, 2026

(54) TERMINAL DEVICE, DISPLAY APPARATUS, AND DISPLAY PANEL AND MANUFACTURING METHOD THEREFOR

(71) Applicants: Chengdu BOE Optoelectronics Technology Co., Ltd., Sichuan (CN); BOE Technology Group Co. Ltd., Beijing (CN)

(72) Inventors: Lifeng Chen, Beijing (CN); Yao Hu, Beijing (CN); Ruoxiang Li, Beijing (CN); Qifu Ran, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 468 days.

(21) Appl. No.: 18/548,659

(22) PCT Filed: Oct. 28, 2021

(86) PCT No.: PCT/CN2021/127082
§ 371 (c)(1),
(2) Date: Sep. 1, 2023

(87) PCT Pub. No.: WO2023/070450
PCT Pub. Date: May 4, 2023

(65) Prior Publication Data
US 2024/0147779 A1    May 2, 2024

(51) Int. Cl.
*H10K 59/122*        (2023.01)
*H10K 59/12*         (2023.01)
(Continued)

(52) U.S. Cl.
CPC ....... *H10K 59/122* (2023.02); *H10K 59/1201* (2023.02); *H10K 59/38* (2023.02); *H10K 59/8792* (2023.02)

(58) Field of Classification Search
CPC .. H10K 59/122; H10K 59/1201; H10K 59/38; H10K 59/8792; H10K 2102/351
See application file for complete search history.

(56) References Cited

U.S. PATENT DOCUMENTS

| | | | |
|---|---|---|---|
| 2017/0179420 A1* | 6/2017 | Lee | H10K 71/166 |
| 2018/0069194 A1* | 3/2018 | Ono | G09G 3/3266 |
| 2024/0057391 A1* | 2/2024 | Lee | H10K 59/122 |

FOREIGN PATENT DOCUMENTS

| | | | | |
|---|---|---|---|---|
| CN | 110808340 A | * | 2/2020 | H10K 59/1315 |
| CN | 113035921 A | * | 6/2021 | H10K 59/38 |

(Continued)

OTHER PUBLICATIONS

CN 110808340 A, machine translation (Year: 2020).*

(Continued)

*Primary Examiner* — Tracie Y Green
(74) *Attorney, Agent, or Firm* — Calfee, Halter & Griswold LLP

(57) ABSTRACT

A terminal device, a display apparatus, and a display panel and a manufacturing method therefor. The display panel comprises: a drive backplane, which has a display region comprising a light-transmitting display region and a main display region, the light-transmitting display region comprising a light-transmitting region; a pixel definition layer, which comprises openings including a first opening and a second opening; a plurality of light-emitting devices defined in the openings; and a color film layer. The opening spacing between two adjacent first openings satisfies a specific relational expression, thereby improving the light transmittance and also preventing cross-color.

16 Claims, 8 Drawing Sheets

(51) Int. Cl.
    H10K 59/38        (2023.01)
    H10K 59/80        (2023.01)

(56)           References Cited

FOREIGN PATENT DOCUMENTS

WO     WO-2021212333 A1 * 10/2021 ........... H10K 50/844
WO     WO-2022188459 A1 * 9/2022 ........... H10K 59/122

OTHER PUBLICATIONS

CN 113035921 A,machine translation (Year: 2021).*
WO 2021212333 A1, machine translation (Year: 2021).*
WO 2022188459 A1, machine translation (Year: 2022).*

* cited by examiner

TERMINAL DEVICE, DISPLAY APPARATUS, AND DISPLAY PANEL AND MANUFACTURING METHOD THEREFOR

CROSS-REFERENCE OF RELATED APPLICATION

The present disclosure is a National Stage of International Application No. PCT/CN2021/127082, filed on Oct. 28, 2021, the entire contents of which are incorporated herein by reference in their entirety.

TECHNICAL FIELD

The present disclosure relates to the field of display technologies, and in particular, to a terminal device, a display apparatus, a display panel, and a method for manufacturing the display panel.

BACKGROUND

Currently, display panels have been widely used in various electronic devices for displaying images. At the same time, for terminal device such as mobile phone, in order to increase the screen ratio, the under display camera technology is gaining widespread attention, but the existing light-transmitting display area under display is prone to cross-color, resulting in abnormal pictures.

It should be noted that the information disclosed in the above background section is only for enhancing the understanding of the background of the present disclosure, and therefore may include information that does not constitute the prior art known to those of ordinary skill in the art.

SUMMARY

The purpose of the present disclosure is to provide a terminal device, a display device, a display panel, and a method for manufacturing the display panel.

According to an aspect of the present disclosure, there is provided a display panel, including: a driving backplane having a display area, the display area includes a light-transmitting display area and a main display area, and the light-transmitting display area includes a light-transmitting area; a pixel definition layer disposed on a side of the driving backplane and including a plurality of openings, the openings include a first opening located in the light-transmitting area and a second opening located in the main display area; a plurality of light-emitting devices defined in the openings in one-to-one correspondence, at least two of the light-emitting devices emit light in different colors; a color film layer disposed on a side of the pixel definition layer away from the driving backplane, and comprising spacers and a plurality of filter parts separated by the spacers; in a direction perpendicular to the driving backplane, the openings are disposed in one-to-one correspondence with the filter parts, a spacer corresponding to the light-transmitting area is of transparent structure, and a spacer corresponding to the main display area is of light-shielding structure; colors of the filter parts are same as light-emitting colors of light-emitting devices in corresponding openings; a distance between edges of two adjacent openings on a surface of the pixel definition layer away from the driving backplane is an opening interval; the opening interval between two adjacent first openings satisfies the following relationship:

$$S_1 > 2(D_1 H_1 / M_1 + H_1 / \tan \varphi_1);$$

wherein, $S_1$ is the opening interval between the two adjacent first openings;

$D_1$ is a maximum width of an edge of the light-emitting device in the first opening in a direction parallel to the pixel definition layer;

$M_1$ is a thickness of an area of the pixel definition layer corresponding to the light-transmitting area;

$H_1$ is a distance between a surface of the pixel definition layer corresponding to the light-transmitting area away from the driving backplane and a surface of the color film layer close to the driving backplane;

$\varphi_1$ is an angle between a side wall of the first opening and a side surface of the driver backplane provided with the pixel definition layer, and $0° < \varphi_1 \geq 90°$.

In an exemplary embodiment of the present disclosure, the light-emitting device includes: a first electrode disposed on a same side of the driving backplane as the pixel definition layer, and an edge of the first electrode is covered by the pixel definition layer; a light-emitting functional layer disposed on a surface of the first electrode away from the driving backplane; a second electrode covering the light-emitting functional layer; the maximum width of the edge of the light-emitting device in the first opening in a direction parallel to the pixel definition layer is: a maximum width of the edge of the first opening on a surface of the pixel definition layer close to the driving backplane in the direction parallel to the pixel definition layer.

In an exemplary embodiment of the present disclosure, a thickness of an area of the pixel definition layer located between the two adjacent first openings is greater than a thickness of an area of the pixel definition layer located between two adjacent second openings.

In an exemplary embodiment of the present disclosure, the display panel further includes: a support column disposed on a surface of the pixel definition layer away from the driving backplane corresponding to an area outside the light-transmitting area.

In an exemplary embodiment of the present disclosure, the thickness of the area of the pixel definition layer located between two adjacent first openings is approximately equal to a sum of the thickness of the area of the pixel definition layer located between two adjacent second openings and the thickness of the support column.

In an exemplary embodiment of the present disclosure, the display panel further includes: an encapsulation layer covering the light-emitting devices, a thickness of the encapsulation layer corresponding to the light-transmitting area is smaller than a thickness of the encapsulation layer corresponding to the main display area; the color film layer is disposed on a surface of the encapsulation layer away from the driving backplane, and is recessed in an area corresponding to the light-transmitting area.

In an exemplary embodiment of the present disclosure, the encapsulation layer includes: a first inorganic layer covering the light-emitting devices; an organic layer disposed on a surface of the first inorganic layer away from the driving backplane; a thickness of the organic layer corresponding to the light-transmitting area is smaller than a thickness of the organic layer corresponding to the main display area; a second inorganic layer covering the organic layer and recessed in an area of the organic layer corresponding to the light-transmitting area; the color film layer is disposed on a surface of the second inorganic layer away from the driving backplane, and is recessed in an area corresponding to the light-transmitting area.

In an exemplary embodiment of the present disclosure, the display panel further includes: a first inorganic layer covering the light-emitting devices; an organic layer disposed on a surface of the first inorganic layer away from the driving backplane; the thickness of the organic layer is 6 μm-12 μm; a second inorganic layer covering the organic layer; the color film layer is disposed on a side of the second inorganic layer away from the driving backplane.

In an exemplary embodiment of the present disclosure, a maximum width of an orthographic projection of at least one of the first openings on the driving backplane is smaller than a maximum width of an orthographic projection of at least one of the second openings on the driving backplane.

In an exemplary embodiment of the present disclosure, the light-transmitting display area further comprises a transition area surrounding the light-transmitting area; the spacer corresponding to the transition area is of a light-shielding structure, and thicknesses of the spacers corresponding to the transition area decrease towards a direction close to the light-transmitting area.

In an exemplary embodiment of the present disclosure, the transition area includes a plurality of sub-areas surrounding the light-transmitting area in sequence, and thicknesses of the spacers corresponding to the same sub-area are same, and thicknesses of the spacers corresponding to different sub-areas decrease toward the direction close to the light-transmitting area; thickness of a spacer corresponding to a sub-area farthest from the light-transmitting area is approximately equal to a thickness of a spacer corresponding to the main display area.

In an exemplary embodiment of the present disclosure, the color film layer includes: a light-shielding layer disposed on a side of the pixel definition layer away from the driving backplane; an orthographic projection of the light-shielding layer on the driving backplane is located outside the light-transmitting area, and the light-shielding layer includes a plurality of light-shielding spacers distributed at intervals; a filter layer disposed on a same layer as the light-shielding layer and including a plurality of filter parts distributed in an array, and orthographic projections of the filter parts on the driving backplane are at least distributed in the light-transmitting area and the main display area; filter parts corresponding to the main display area are separated by the light-shielding spacers; a transparent protective layer covering the light-shielding layer and the filter layer, and the transparent protective layer fills a transparent spacer between the filter parts corresponding to the light-transmitting areas.

In an exemplary embodiment of the present disclosure, the display panel further includes: a touch layer disposed between the color film layer and the pixel definition layer, and an area of the touch layer corresponding to the light-transmitting area is hollowed out.

According to one aspect of the present disclosure, there is provided a method for manufacturing a display panel, including: forming a driving backplane with a display area, the display area includes a light-transmitting display area and a main display area, and the light-transmitting display area includes a light-transmitting area; forming a plurality of light-emitting devices and a pixel definition layer including a plurality of openings on a side of the driving backplane, the openings include a first opening located in the light-transmitting area and a second opening located in the main display area, the light-emitting devices are defined in the openings in one-to-one correspondence; forming a color film layer on a side of the pixel definition layer away from the driving backplane, the color film layer includes spacers and a plurality of filter parts separated by the spacers; in a direction perpendicular to the driving backplane, an area of the spacers corresponding to the light-transmitting area is of a transparent structure, and an area of the spacers corresponding to the main display area is of a light-shielding structure; a color of the filter part is same as a light-emitting color of an light-emitting device in corresponding opening; a distance between edges of two adjacent openings on a surface of the pixel definition layer away from the driving backplane is an opening interval; the opening interval between the two adjacent first openings satisfies the following relationship:

$$S_1 \geq 2(D_1 H_1 / M_1 + H_1 / \tan \varphi_1);$$

wherein, $S_1$ is the opening interval between the two adjacent first openings;

$D_1$ is a maximum width of an edge of the light-emitting device in the first opening in a direction parallel to the pixel definition layer;

$M_1$ is a thickness of an area of the pixel definition layer corresponding to the light-transmitting area;

$H_1$ is a distance between a surface of the pixel definition layer corresponding to the light-transmitting area away from the driving backplane and a surface of the color film layer close to the driving backplane;

$\varphi_1$ is an angle between a side wall of the first opening and a side surface of the driver backplane provided with the pixel definition layer, and $0° < \varphi_1 \leq 90°$.

According to one aspect of the present disclosure, a display device is provided, including the display panel described in any one of the above.

According to an aspect of the present disclosure, a terminal device is provided, including: the display device described in any one of the above; an imaging device disposed on a side of the driving backplane away from the pixel definition layer, corresponding to the light-transmitting area, and capable of capturing images through the light-transmitting area.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
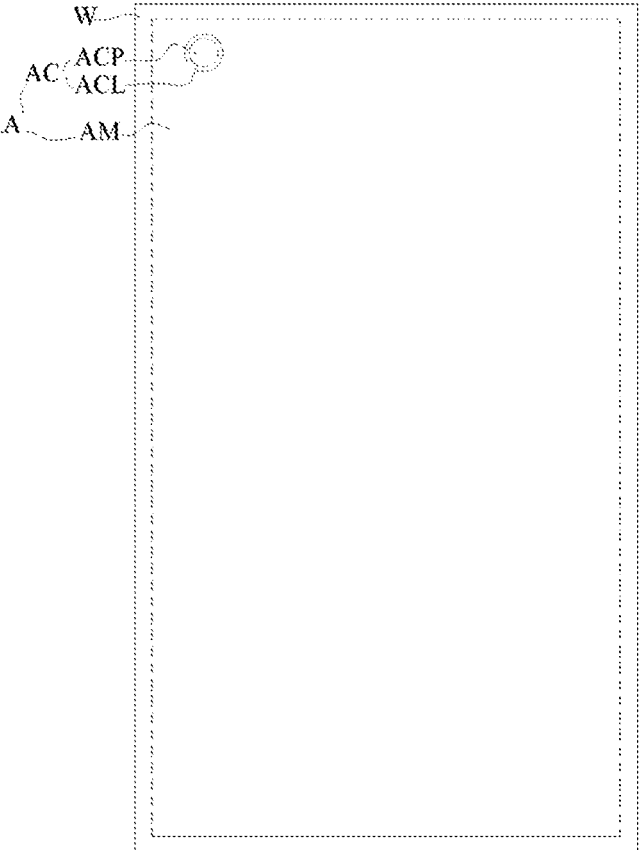
FIG. 1 is a top view of an embodiment of a display panel of the present disclosure.

Exemplary embodiments will now be described more fully with reference to the accompanying drawings. Exemplary embodiments may, however, be embodied in many forms and should not be construed as limited to the embodiments set forth herein; rather, these embodiments are provided so that this disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one illustrative component to another component, these terms are used in this specification only for convenience, for example, according to the direction of the example described in the accompanying drawings. It will be appreciated that if the illustrated device is turned over so that it is upside down, then elements described as being "upper" will become elements that are "lower". When a structure is "on" another structure, it may mean that a structure is integrally formed on another structure, or that a structure is "directly" placed on another structure, or that a structure is "indirectly" placed on another structure through other structure.

The terms "a", "an", "the", "said" and "at least one" are used to indicate the presence of one or more elements/components/etc; the terms "including" and "have" are used to indicate the meaning of open inclusion and to indicate that there may be other elements/components/etc. in addition to the listed ones; the terms "first", "second" and "third" etc. are only used as a marker, not a limit on the number of its objects.

Due to the upper limit of the precision of the manufacturing process, the restrictions on shape and size in this description, such as: circles, trapezoids and other shapes, are not limited to circles and trapezoids without error. The outline of a circle can also be a wavy or broken line, and the waist of the trapezoid may be a curve or broken line, etc., but it should be regarded as still circular and trapezoidal, as long as it is within the error range allowed by the manufacturing precision. At the same time, concepts such as plane and vertical mentioned in the present disclosure are all within the allowable range of manufacturing process precision.

Figure 2:
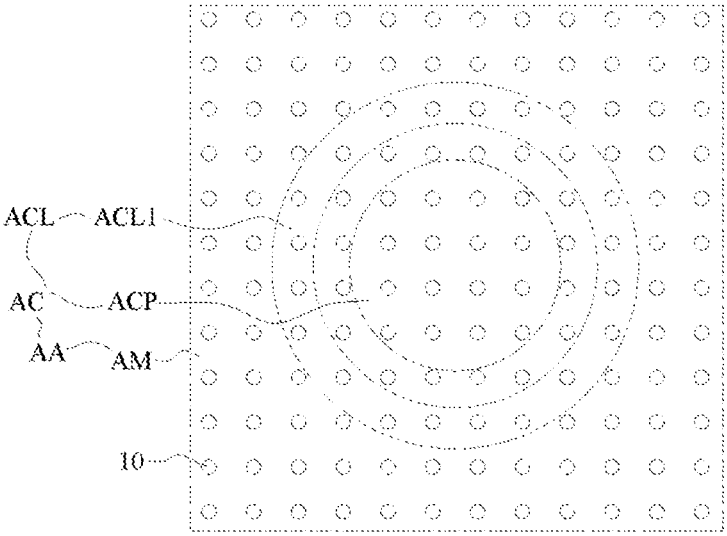
FIG. 2 is a partial enlarged view of an embodiment of the display panel of the present disclosure.
Figure 3:
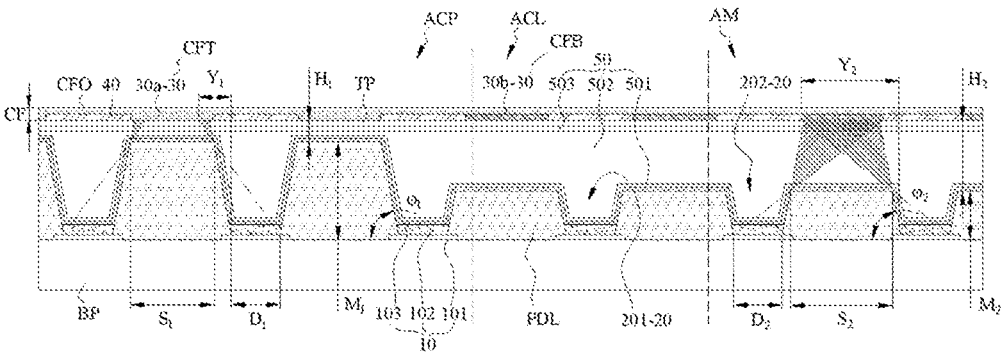
FIG. 3 is a schematic diagram of Embodiment 1 of the display panel of the present disclosure.

An embodiment of the present disclosure provides a display panel, as shown in FIG. 1 to FIG. 3, the display panel includes a driving backplane BP, a pixel definition layer PDL, a plurality of light-emitting devices OLED and a color film layer CF, wherein:

The driving backplane BP has a display area AA, and the display area AA includes a light-transmitting display area AC and a main display area AM, and the light-transmitting display area AC includes a light-transmitting area ACP.

The pixel definition layer PDL is disposed on a side of the driving backplane BP, and includes a plurality of openings 20, and the openings 20 include a first opening 201 located in the light-transmitting area ACP and a second opening 202 located in the main display area AM.

A plurality of light-emitting devices 10 are defined in the openings 20 in one-to-one correspondence, and at least two light-emitting devices 10 have different light emitting colors.

The color film layer CF is disposed on the side of the pixel definition layer PDL away from the driving backplane BP, and includes a spacer 30 and a plurality of filter parts 40 separated by the spacer 30; the openings 20 and the filter parts 40 are provided in one-to-one correspondence in the direction perpendicular to the driving backplane BP; the area of the spacer 30 corresponding to the light-transmitting area ACP is a transparent structure (transparent spacer 30$a$), and the area of the spacer 30 corresponding to the main display area AM is a light-shielding structure (light-shielding spacer 30$b$); the color of the filter part 40 is the same as the light emitting color of the light-emitting device 10 in the corresponding opening 20.

The distance between the edges of two adjacent first openings 201 on the surface of the pixel definition layer PDL away from the driving backplane BP is the opening interval, and the opening interval satisfies the following relationship:

$$S_1 \geq 2(D_1 H_1 / M_1 + H_1 / \tan \varphi_1);$$

Wherein, $S_1$ is the opening interval between two adjacent first openings 201;

$D_1$ is the maximum width of the edge of the light-emitting device 10 in the first opening 201 in a direction parallel to the pixel definition layer PDL;

$M_1$ is the thickness of the area of the pixel definition layer PDL corresponding to the light-transmitting area ACP;

$H_1$ is the distance between the surface of the area of the pixel definition layer PDL corresponding to the light-transmitting area ACP away from the driving backplane BP and the surface of the color film layer CF close to the driving backplane BP;

$\varphi_1$ is the angle between the side wall of the first opening 201 and the side surface of the driving backplane BP provided with the pixel definition layer PDL, and $0° < \varphi_1 \leq 90°$.

The display panel in the embodiment of the present disclosure can take images through the light-transmitting display area AC by the imaging device; the light-emitting devices 10 in the light-transmitting display area AC and the main display area AM can emit light to display images, thereby realizing under-display photography. Since the spacer 30 corresponding to the light-transmitting area ACP is set as a transparent structure, the light transmittance of the light-transmitting display area AC can be improved, which is beneficial to improve the quality of the captured image. The spacer 30 of the light-shielding structure can block light emission from the area where the light emission ranges of the adjacent light-emitting devices 10 overlap, thereby preventing cross-color.

In addition, based on the relationship defining the opening interval, the light emitted by the light-emitting devices 10 in adjacent first openings 201 can be prevented from overlapping in the transparent spacer 30, so that even if light can be emitted from the transparent spacer 30, there is no cross-color phenomenon, that is to say, it can prevent cross-color while improving the light transmittance for the transparent area.

Taking the display panel which is an organic electroluminescence display panel as an example, each part thereof will be described in detail below:

The driving backplane BP has a driving circuit for driving each light-emitting device 10 to emit light. In some embodiments of the present disclosure, the driving backplane BP may include a substrate and a driving circuit layer. The substrate is a flat plate structure, and its material may be hard material such as glass, and also may be soft material such as polyimide. The driving circuit layer can be disposed on a side of the substrate and includes a driving circuit. The display panel can be divided into at least a display area AA and a peripheral area W located outside the display area AA. Correspondingly, the driving circuit layer can include a pixel circuit located in the display area AA and a peripheral circuit located in the peripheral area W, wherein the pixel circuit can be a pixel circuit such as 7T1C, 7T2C, 6T1C or 6T2C, as long as it can drive the light-emitting device 10 to emit light, and its structure is not specifically limited here. The number of pixel circuits is the same as the number of light-emitting devices 10, and the pixel circuits are connected to light-emitting devices 10 in one-to-one correspondence, so as to respectively control each light-emitting device 10 to emit light. Wherein, nTmC indicates that a pixel circuit includes n transistors (indicated by the letter "T") and m capacitors (indicated by the letter "C"). Of course, in other embodiments of the present disclosure, the same pixel circuit can also drive a plurality of light-emitting devices 10.

The peripheral circuit is located in the peripheral area W, and the peripheral circuit is connected to the pixel circuit for inputting a driving signal to the pixel circuit so as to control the light-emitting device 10 to emit light. The peripheral circuit may include a gate drive circuit and a light emission control circuit, and of course, the peripheral circuit may also include other circuits, and the specific structure of the peripheral circuit is not specifically limited here.

The above driving circuit layer may include a plurality of thin film transistors and capacitors, wherein the thin film transistors may be top-gate or bottom-gate type thin film transistors, and each thin film transistor may include an active layer, a gate electrode, a source electrode and a drain electrode. The active layers of the thin film transistors are provided in the same layer, the gate electrodes of the thin film transistors are provided in the same layer, the source electrodes of the thin film transistors are provided in the same layer and the drain electrodes of the thin film transistors are provided in the same layer, so as to simplify the process.

Taking the top-gate type thin film transistor as an example, the driving backplane BP includes a substrate, an active layer, a first gate insulating layer, a gate electrode, a second gate insulating layer, an interlayer dielectric layer, a source-drain layer, and a planarization layer. The active layer is disposed on a side of the substrate, and the first gate insulating layer covers the active layer and the substrate; the gate electrode is disposed on the surface of the first gate insulating layer away from the substrate, and is directly opposite to the active layer; the second gate insulating layer covers the gate electrode and the first gate insulating layer; the interlayer dielectric layer covers the second gate insulating layer; the source-drain layer is disposed on the surface of the interlayer dielectric layer away from the substrate, and includes the source electrode and the drain electrode, and the source electrode and the drain electrode are connected to both ends of the active layer through the contact holes; the planarization layer covers the source-drain layer and the interlayer dielectric layer. Of course, the driving circuit layer may also include other film layers, as long as it can drive the light-emitting device 10 to emit light, which will not be described in detail here.

As shown in FIG. 1 and FIG. 3, the display area AA of the driving backplane BP may include a light-transmitting display area AC and a main display area AM. The light-transmitting display area AC may include a light-transmitting area ACP through which light can be transmitted. Both of the main display area AM and the light-transmitting display area AC are provided with a pixel circuit capable of driving the light-emitting device 10 to display images. The light-transmitting display area AC may include a light-transmitting area ACP through which light can be transmitted, and the imaging device can capture images through the light-transmitting display area AC.

As shown in FIG. 3, the range of each light-emitting device 10 can be defined by the pixel definition layer PDL. The pixel definition layer PDL can be disposed on a side of the driving backplane BP. For example, the pixel definition layer PDL can be disposed on the surface of the driving circuit layer away from the substrate. At the same time, the pixel definition layer PDL is provided with a plurality of openings 20 penetrating the pixel definition layer PDL along the thickness direction. The openings 20 can be distributed in the light-transmitting display area AC and the main display area AM, and the openings 20 are also distributed in the light-transmitting area ACP. The openings 20 distributed in the light-transmitting area ACP can be defined as first openings 201, and the openings 20 distributed in the main display area AM can be defined as second openings 202, that is, opening 20 can include the first openings 201 and the second openings 202.

The shape of the opening 20, that is, the shape of the edge of the opening 20, may be circular, elliptical, or polygonal, and is not specifically limited here. The sidewall of the opening 20 can shrink toward the driving backplane BP, that is, the edge of the end of the opening 20 close to the driving backplane BP is smaller than the edge of the end of the opening 20 far away from the driving backplane BP, so that the sidewall of the opening 20 has a certain angle with the surface of the driving backplane BP close to the pixel definition layer PDL. The angle may be an acute angle. Of course, the angle may also be a right angle, that is, the opening 20 may also be a straight hole structure.

In some embodiments of the present disclosure, the shape of the first opening 201 corresponding to the light-transmitting area ACP can be circular, avoiding edges and corners on sidewalls and borders of the first openings 201, and preventing the edges and corners from diffracting the light passing through the light-transmitting area ACP from the outside, and further preventing problems that affect the imaging quality of the imaging device, thereby improving the imaging quality of under display camera. Of course, the shape of the second opening 202 can also be circular.

The light-emitting devices 10 can be disposed in openings 20, and one light-emitting device 10 is disposed in each opening 20, so that the light-emitting range of the light-emitting device 10 can be limited by the opening 20. The surface of each light-emitting device 10 away from the driving backplane BP is located on the side of the surface of the pixel definition layer PDL close to the driving backplane BP, where the surface of the pixel definition layer PDL is away from the driving backplane BP, that is, the light-emitting device 10 does not protrude from the opening 20 where it is located.

In some embodiments of the present disclosure, the light-emitting device 10 may be an organic light-emitting diode.

As shown in FIG. 3, each light-emitting device 10 may include a first electrode 101, a light-emitting functional layer 102 and a second electrode 103 stacked in sequence along the direction away from the driving backplane BP, wherein:

The first electrode 101 and the pixel definition layer PDL can be disposed on the same side of the driving backplane BP. For example, the first electrode 101 is disposed on the surface of the planarization layer away from the substrate. Each opening 20 can expose a first electrode 101, and the edge of the end of the opening 20 close to the drive backplane BP can be located within the edge of the first electrode 101, thereby covering the edge of the first electrode 101 and exposing a part of the first electrode 101. At the same time, the first electrode 101 can be connected to a drain electrode or a source electrode of a thin film transistor of a pixel circuit through a contact hole in the driving backplane BP, so as to receive a signal from the pixel circuit.

The light-emitting functional layer 102 is located in the opening 20 and is located on the surface of the first electrode 101 away from the driving backplane BP, and the light-emitting functional layer 102 may include a hole injection layer, a hole transport layer, a light-emitting material layer, an electron transport layer and an electron injection layer stacked in sequence along the direction away from the driving backplane BP. The light-emitting functional layer 102 of each light-emitting device 10 is distributed at intervals independently and emits light independently.

At least a part of the second electrode 103 is located in the opening 20 and covers the light-emitting functional layer 102, and can be connected to a power signal terminal of a peripheral circuit to receive a power signal. When displaying an image, a data signal can be applied to the first electrode 101 through the pixel circuit, and a power signal can be applied to the second electrode 103 through the power signal terminal, so that the light-emitting functional layer 102 can emit light. The specific principle of organic electroluminescence is not described here in details. In some embodiments of the present disclosure, the light-emitting devices 10 can share the second electrode 103, and the second electrode 103 can be a continuous film layer which covers the light-emitting functional layer 102 in each opening 20 and the surface of the pixel definition layer PDL away from the driving backplane BP. The second electrode 103 is recessed in the opening 20 so as to be in contact with the light-emitting functional layer 102 in the opening 20. Meanwhile, the second electrode 103 may extend to the peripheral area W and be connected with the peripheral circuit. The portion of the second electrode 103 located in each opening 20 may form the light-emitting device 10 with the light-emitting functional layer 102 and the first electrode 101 in the opening 20.

The light-emitting device 10 can be defined by the above-mentioned plurality of openings 20. The boundary of any light-emitting device 10 is the edge of the corresponding opening 20 on the surface of the pixel definition layer PDL close to the driving backplane BP. Of course, the boundary of the light-emitting device 10 may also be the edge of the light-emitting functional layer 102 in the opening 20.

In some embodiments of the present disclosure, the light-emitting device 10 may include a first light-emitting device, a second light-emitting device, and a third light-emitting device with different light emitting colors. For example, the first light-emitting device emits red light, the second light-emitting device emits green light, and the third light-emitting device emits blue light.

In addition, the light-emitting devices 10 can be divided into a plurality of pixels, and each pixel can include a plurality of light-emitting devices 10 with different light-emitting colors. For example, a pixel can include a first light-emitting device that emits red light, a second light-emitting device that emits green light and a third light-emitting device that emits blue light. There may be one or more light-emitting devices of any color in the same pixel. The shapes and sizes of the openings 20 corresponding to the light-emitting devices of different colors may be same or different. For example, the area of the orthographic projection of the opening 20 corresponding to the first light-emitting device on the driving backplane 1 may be larger than the area of the orthographic projection of the opening 20 corresponding to the second light-emitting device on the driving backplane 1.

Two adjacent pixels can share a part of the light-emitting devices 10. Color borrowing is achieved through sub-pixel rendering (SPR) and other methods, so as to emit light. The resolution is improved without increasing the number of light-emitting devices. The specific principle will not be described in detail here. Of course, the light-emitting devices 10 of two adjacent pixels can also be independently arranged and not shared, so that they can emit light independently.

In some embodiments of the present disclosure, as shown in FIG. 3, the display panel can further include an encapsulation layer 50 that can cover light-emitting devices 10 and is used to block the erosion of the light-emitting device 10 by external water and oxygen, so as to play a protective role. The color film layer CF may be disposed on a side of the encapsulation layer 50 away from the driving backplane BP.

In some embodiments of the present disclosure, the encapsulation can be achieved by thin film encapsulation (Thin-Film Encapsulation, TFE). Specifically, the encapsulation layer 50 can include a first inorganic layer 501, an organic layer 502 and a second inorganic layer 503, where:

The first inorganic layer 501 covers light-emitting devices 10, and the material of the first inorganic layer 501 may include inorganic insulating material such as silicon nitride and silicon oxide. The first inorganic layer 501 may be recessed along with the second electrode 103 at the position of the opening 20.

The organic layer 502 can be formed on the surface of the first inorganic layer 501 away from the drive backplane BP by inkjet printing, etc., and the boundary of the organic layer 502 can be limited to the inner side of the boundary of the first inorganic layer 501 by a barrier dam located in the peripheral region W. The organic layer 502 can be used to release interlayer stress and play a buffer role. The organic layer 502 can fill the depression of the first inorganic layer 501 at the position of the opening 20. The surface of the organic layer 502 away from the driving backplane BP can be flat, so as to achieve planarization. The material of the organic layer 502 may include acrylic-based material.

The second inorganic layer 503 covers the organic layer 502 and the first inorganic layer 501 not covered by the organic layer 502. The organic layer 502 can be covered by the second inorganic layer 503 and the first inorganic layer 501 to block the intrusion of water and oxygen.

As shown in FIG. 3, the color film layer CF may be disposed on the side of the pixel definition layer PDL away from the driving backplane BP. For example, the color film layer CF is disposed on the side of the encapsulation layer 50 away from the driving backplane BP. At the same time, the color film layer CF has a spacer 30 and a plurality of filter parts 40 separated by the spacer 30, wherein: in the direction perpendicular to the driving backplane BP, the filter parts 40 can be arranged in one-to-one correspondence with the openings 20. Each opening 20 is located within the orthographic projection of a filter part 40 on the pixel definition layer PDL, so that the light emitted by the light-emitting device 10 in each opening 20 can irradiate the corresponding filter part 40, and the filter part 40 can be used to transmit monochromatic light. For example, the monochromatic light can be red light, blue light, green light, etc. The light emitting color of any light-emitting device 10 is the same as that of the corresponding filter part 40 to ensure normal light emission.

At the same time, the filter part 40 can block a part of the external light from entering the display panel, thereby preventing the display effect from being affected by the reflection of the external light by the second electrode 103, the first electrode 101 or the circuits in the driving backplane BP. That is to say, the circular polarizer used to reduce reflection can be replaced by the color film layer CF. The thickness of the circular polarizer is usually relatively large. Therefore, using the color film layer CF to reduce reflection is beneficial to reduce the thickness of the display panel.

The area of the spacer 30 corresponding to the light-transmitting area ACP can be set as a transparent structure, which is the spacer 30*a*, thereby improving the light transmittance of the light-transmitting area ACP. The aforementioned transparent structure can mean that the light transmittance of the transparent structure is not less than 80%, for example, 85%, 90%, 99%, etc., in order to improve the imaging quality of the imaging device. At the same time, the area of the spacer 30 corresponding to the main display area AM can be set as a light-shielding structure, which is the spacer 30*b*, and is used to block external light. The effect of reducing reflection can be improved at least in areas other than the light-transmitting area ACP.

In some embodiments of the present disclosure, the color film layer CF may include a light shielding layer CFB, a filter layer CFT, and a transparent protective layer CFO, wherein:

The light-shielding layer CFB can be disposed on the side of the pixel definition layer PDL away from the driving backplane BP. The orthographic projection of the light-shielding layer CFB on the driving backplane BP is outside the light-transmitting area ACP, and the light-shielding layer CFB has a plurality of light-shielding spacers 30 distributed at intervals. The material of the light-shielding layer CFB can be black resin material. Of course, other materials can also be used, as long as they can be light-shielding.

The filter layer CFT and the light-shielding layer CFB are provided on the same layer. For example, the filter layer CFT and the light-shielding layer CFB can be provided on the same substrate, or the filter layer CFT and the light-shielding layer CFB can be provided on the surface of the encapsulation layer 50 away from the driving backplane BP. This is not particularly limited here. The filter layer CFT may include a plurality of filter parts 40 distributed in an array. The orthographic projections of the filter parts 40 on the driving backplane BP are at least distributed in the light-transmitting area ACP and the main display area AM. The filter parts 40 corresponding to the main display area AM are separated by the light-shielding spacer 30, and the part between the adjacent filter parts 40 corresponding to the light-transmitting area ACP are hollowed out.

The transparent protective layer CFO can cover the light-shielding layer CFB and the filter layer CFT, and fill the space between the filter parts 40 corresponding to the light-transmitting area ACP, and the transparent protective layer CFO filling the space is the transparent spacer 30*a*, so that the filter parts 40 corresponding to the light-transmitting area ACP are separated by the transparent spacer 30*a*. Correspondingly, the spacer 30 of the color film layer CF includes a transparent spacer 30*a* and a light-shielding spacer 30*b*. Of course, the transparent protective layer CFO also covers the light-shielding partition 30*b*. The material of the transparent protective layer CFO can be the same as that of the organic layer 502, so that the refractive index of the two is the same or approximately the same (the difference between the two is within a certain range). For example, both materials of the transparent protective layer CFO and the organic layer 502 may include acrylic-based materials.

In some embodiments of the present disclosure, as shown in FIG. 3, the display panel may further include a touch layer TP, which may be disposed between the color film layer CF and the pixel definition layer PDL. For example, the touch layer TP may be disposed between the encapsulation layer 50 and the color film layer CF. The touch layer TP can adopt a self-capacitance or mutual-capacitance touch structure, and there is no special limitation on its specific structure, as long as the touch function can be realized. Of course, the touch layer TP can also be disposed on the side of the color film layer CF away from the driving backplane BP, and its specific position and process are not limited here. Alternatively, in the display panel of the present disclosure, the touch layer TP may not be provided, and the color film layer CF may be directly provided on the surface of the encapsulation layer 50 away from the driving backplane BP.

In some embodiments of the present disclosure, if a touch layer TP is provided between the color film layer CF and the pixel definition layer PDL of the display panel, or on the side of the color film layer CF away from the driving backplane BP, then the area of the touch layer TP corresponding to the light-transmitting area ACP is hollowed out, so as to avoid obstructing the light-transmitting area ACP by the touch layer TP and improve the light transmittance.

In some embodiments of the present disclosure, the touch layer TP may include a buffer layer, a first conductive layer, an isolation layer, a second conductive layer, and an insulating layer, wherein:

The buffer layer can be disposed on the surface of the encapsulation layer 50 away from the driving backplane BP, and the material of the buffer layer can be inorganic insulating material such as silicon oxide and silicon nitride. The first conductive layer may be disposed on the surface of the buffer layer away from the driving backplane BP. The isolation layer covers the first conductive layer, the material of the isolation layer is insulating material, and the isolation layer is provided with a plurality of via holes exposing a part of the first conductive layer. The second conductive layer may be disposed on the surface of the isolation layer away from the driving backplane BP, and connected to the first conductive layer through the via hole. The insulating layer can cover the second conductive layer and the isolation layer, and the material of the insulating layer can be optical glue, or insulating material such as acrylic.

The first conductive layer may include a plurality of first connecting bridges distributed at intervals. The first connecting bridges may extend along the first direction. Each via hole exposes a part of area of a first connecting bridge, and one same first connecting bridge is exposed by two via holes, and the two via holes respectively expose different areas of the first connecting bridge, so that the two via holes can be connected through one first connecting bridge. Certainly, one same first connecting bridge may also be exposed by more via holes.

The second conductive layer may include a second connecting bridge and a plurality of first touch electrodes and a plurality of second touch electrodes insulated from each other. Two first touch electrodes adjacent in the first direction can be connected to the same first connecting bridge through different via holes. Two second touch electrodes adjacent in the second direction can be connected through a second connecting bridge, and the second connecting bridge can extend along the second direction. The first direction and the second direction are mutually perpendicular directions. The touch position can be determined by sensing the change of capacitance between the first touch electrode and the second touch electrode.

Both the first conductive layer and the second conductive layer have a grid structure, which improves the light transmittance while realizing the touch function.

Figure 10:
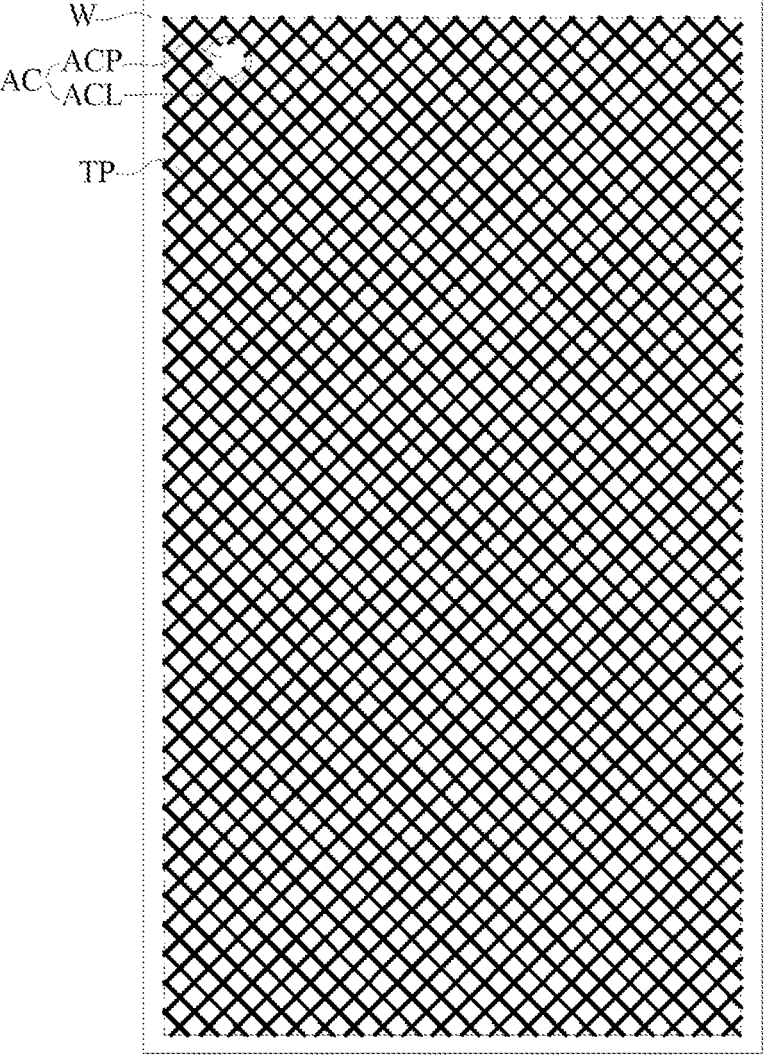
FIG. 10 is a schematic diagram of the touch layer in an embodiment of the display panel of the present disclosure.

It should be noted that, as shown in FIG. 10, the hollow area of the touch layer TP corresponding to the light-transmitting area ACP may mean that the first conductive layer and the second conductive layer form a through hole in the area corresponding to the light-transmitting area ACP, and the buffer layer and the insulating layer can be transparent continuous film layers. Certainly, the buffer layer and the insulating layer may also be hollowed out in the area corresponding to the ACP. The through hole may be a grid of the grid-like structure of the first conductive layer and the second conductive layer, that is, the grid lines in the grid-like structure may not be disconnected in the area corresponding to the light-transmitting area ACP; or, the area passing through the light-transmitting area ACP in the grid-like structure may also be disconnected to form a through hole; the details depend on the size of the light-transmitting area ACP and the grid.

The solution for improving the cross-color problem of the display panel of the present disclosure is described in detail below:

The inventor found that: for any light-emitting device 10, the emitted light is irradiated to the color film layer CF under the limitation of the opening 20, and the irradiation range covers the filter part 40 corresponding to the light-emitting device 10, and the boundary of the irradiation range is located at the spacer 30 adjacent to the filter part 40, and the irradiation ranges of two adjacent light-emitting devices 10 on the color film layer CF overlap. If the emission colors of the two adjacent light-emitting devices 10 are different, there will be cross-color. However, for the spacer 30 of the light-shielding structure, it can block the light emission after the cross-color, so it will not affect the display effect; but the spacer 30 of the transparent structure cannot block the light after the cross-color, and the image displayed on the area of the display panel corresponding to the light-transmitting area ACP appears cross-color.

Based on the above analysis, in order to improve the cross-color problem in the light-transmitting area ACP, a solution is proposed based on the display panel above, specifically:

The distance between the edge of the light-emitting device 10 in any opening 20 and the edge of the irradiation range of the light-emitting device 10 on the color film layer CF, that is, the range where the light emitted by the light-emitting device 10 diffuses to the outside of the edge when it reaches the color film layer CF, that is, the diffusion range, which satisfies the following relationship:

$$Y=(DH/M+H/\tan \varphi); \tag{1}$$

Wherein, Y is the distance between the edge of the light-emitting device 10 in any opening 20 and the edge of the irradiation range of the light-emitting device 10 on the color film layer CF.

D is the maximum width of the edge of the light-emitting device 10 in any opening 20 in a direction parallel to the pixel definition layer PDL. Further, the maximum width can be defined as: the maximum width of the edge of any opening 20 on the surface of the pixel definition layer PDL close to the drive backplane BP in a direction parallel to the pixel definition layer PDL. For example, any opening 20 is a circular hole that shrinks toward the driving backplane BP, and D is the diameter of the edge of the end of the opening 20 close to the driving backplane BP.

M is the thickness of the pixel definition layer PDL.

H is the distance between the surface of the pixel definition layer PDL away from the driving backplane BP and the surface of the color film layer CF close to the driving backplane BP.

$\varphi$ is the angle between the side wall of any opening 20 and the side of the driving backplane BP provided with the pixel definition layer PDL, and $0°<\varphi\leq90°$.

Based on the above relationship (1), the relationship of the diffusion range $Y_1$ of the light-emitting device 10 corresponding to the light-transmitting area ACP can be obtained:

$$Y_1=(D_1H_1/M_1+H_1/\tan \varphi_1); \tag{2}$$

$Y_1$ is the distance between the edge of the light-emitting device 10 in the first opening 201 and the edge of the irradiation range of the light-emitting device 10 on the color film layer CF.

$D_1$ is the maximum width of the edge of the first opening 201 on the surface of the pixel definition layer PDL close to the drive backplane BP in a direction parallel to the pixel definition layer PDL. For example, any opening 20 is a circular hole which shrinks toward the drive backplane BP, and $D_1$ is the diameter of the edge of the end of the first opening 201 close to the driving backplane BP.

$M_1$ is the thickness of the area of the pixel definition layer PDL corresponding to the light-transmitting area ACP.

$H_1$ is the distance between the surface of the area of the pixel definition layer PDL corresponding to the light-transmitting area ACP away from the driving backplane BP and the surface of the color film layer CF close to the driving backplane BP.

$\varphi_1$ is the angle between the side wall of the first opening 201 and the side surface of the driving backplane BP provided with the pixel definition layer PDL, and $0°<\varphi_1\leq90°$.

Similarly, it can be concluded that:

$$Y_2=(D_2H_2/M_1+H_2/\tan \varphi_2); \tag{3}$$

Wherein, $Y_2$ is the distance between the edge of the light-emitting device 10 in the second opening 202 and the edge of the irradiation range of the light-emitting device 10 on the color film layer CF.

$D_2$ is the maximum width of the second opening 202 at the edge of the surface of the pixel definition layer PDL close to the drive backplane BP in the direction parallel to the pixel definition layer PDL. For example, any opening 20 is a circular hole which shrinks toward the drive backplane BP, and $D_2$ is the diameter of the edge of the end of the second opening 202 close to the driving backplane BP.

$M_2$ is the thickness of the area of the pixel definition layer PDL corresponding to the main display area AM.

$H_2$ is the distance between the surface of the pixel definition layer PDL corresponding to the main display area AM away from the driving backplane BP and the surface of the color film layer CF close to the driving backplane BP.

$\varphi_2$ is the angle between the side wall of the second opening 202 and the side of the driving backplane BP provided with the pixel definition layer PDL, and $0°<\varphi_2\leq90°$.

In order to improve cross-color, the distance between the edges of two adjacent openings 20 on the surface of the pixel definition layer PDL away from the driving backplane BP can be defined as the opening interval, and the opening interval between the first openings 201 satisfies the following Relationship:

$$S_1 \geq 2Y_1; \tag{4}$$

Wherein, $S_1$ is the opening interval of the first opening 201.

Through the relationship (2), that is, $S_1 \geq 2(D_1H_1/M_1+H_1/\tan \varphi_1)$, it can be ensured that the irradiation ranges of the light emitted by the light-emitting devices 10 in two adjacent first openings 201 on the color film layer CF do not overlap, that is, the diffusion ranges do not overlap, so that even if light emits from the transparent spacer 30, there will be no cross-color.

Based on the above-mentioned relationships (2) and (4), a plurality of embodiments that can improve the cross-color problem are listed as follows:

Embodiment 1

As shown in FIG. 3, the problem of cross-color can be improved by increasing the thickness of the pixel definition layer PDL in the light-transmitting area ACP. In this embodiment, the thickness of the area of the pixel definition layer PDL located between two adjacent first openings 201 is made larger than the thickness of the area of the pixel definition layer PDL located between two adjacent second openings 202, that is, $M_1>M_2$. In some examples, $M_1$ may be twice as large as $M_2$, for example, $M_1$ is 3 μm and $M_2$ is 1.5 μm. At the same time, $\varphi_1=\varphi_2$. Therefore, the purpose of avoiding cross-color can be achieved by increasing the local thickness of the pixel definition layer PDL.

Embodiment 2

Figure 4:
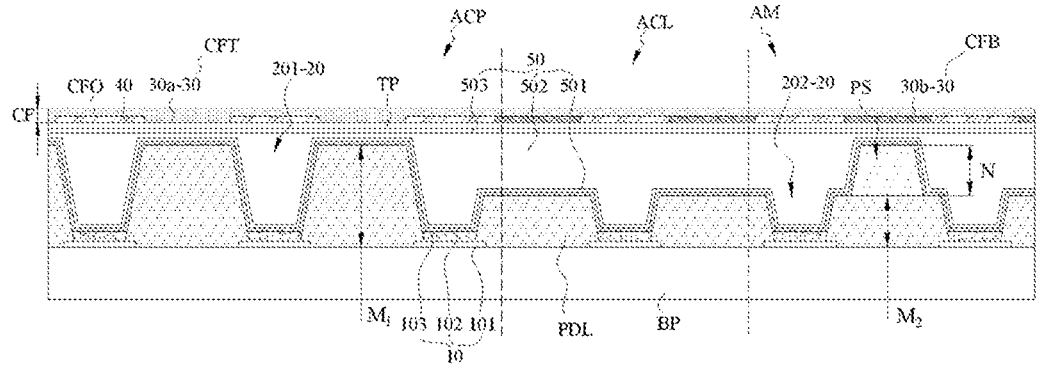
FIG. 4 is a schematic diagram of Embodiment 2 of the display panel of the present disclosure.

As shown in FIG. 4, on the basis of Embodiment 1, the display panel may further include support column PS, which may be provided on the surface of the pixel definition layer PDL away from the driving backplane BP and corresponding to the area other than the light-transmitting area ACP. For example, a support column PS may be provided on the area where the surface of the pixel definition layer PDL away from the driving backplane BP is located in the main display area AM, and the thickness of the support column PS is N. The number of the support columns PS is not specifically limited here, and the support columns PS can be used to support the mask used when forming the light-emitting functional layer 102. The edge of the support column PS are located inside the edge of the pixel definition layer PDL, so as to avoid interference with the light of the light-emitting device 10 in the second opening 202.

As shown in FIG. 4, the thickness of the area of the pixel definition layer PDL located between two adjacent first openings 201 is approximately equal to the sum of the thickness of the area of the pixel definition layer PDL located between two adjacent second openings 202 and the thickness of the support column PS. For example, $M_1=M_2+N$. Of course, due to the error of the manufacturing process, the thickness of the pixel definition layer PDL may not be uniform, and the thickness of different regions may be different, so $M_1 \approx M_2+N$ may exist within the allowable range of error.

The support column PS can be made of the same material as the pixel definition layer PDL, such as photoresist. The pixel definition layer PDL and the support column PS having areas with different thicknesses can be formed simultaneously through a grayscale mask process instead of being formed separately, thereby simplifying the process. Of course, the support column PS may also use a material different from the pixel definition layer PDL, and be formed after the pixel definition layer PDL is formed.

Embodiment 3

Figure 5:
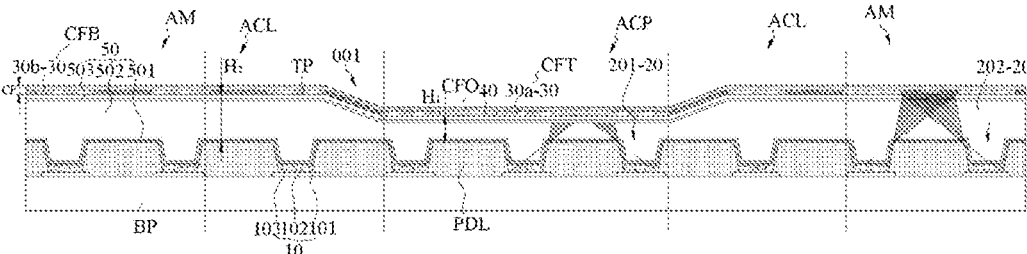
FIG. 5 is a schematic diagram of Embodiment 3 of the display panel of the present disclosure.

As shown in FIG. 5, the thickness of the encapsulation layer 50 corresponding to the light-transmitting area ACP is smaller than the thickness of the encapsulation layer 50 corresponding to the main display area AM, so that the encapsulation layer 50 is recessed toward the driving backplane BP in the area corresponding to the light-transmitting area ACP, thereby achieving local thinning. At the same time, the color film layer CF is disposed on the surface of the encapsulation layer 50 away from the driving backplane BP, and is recessed in the area corresponding to the light-transmitting area ACP, so that the distance from the area of the color filter CF layer corresponding to the light-transmitting area ACP to the pixel definition layer PDL is shortened, that is, $H_1<H_2$. According to the above relationship (2), the purpose of avoiding cross-color can be achieved by reducing $H_1$.

As shown in FIG. 5, in order to achieve local thinning of the encapsulation layer 50, the organic layer 502 can be locally thinned. For example, the thickness of the organic layer 502 corresponding to the light-transmitting area ACP can be made smaller than the thickness of the organic layer 502 corresponding to the main display area AM, so that the organic layer 502 is recessed in the area corresponding to the light-transmitting area ACP relative to the area corresponding to the main display area AM, forming a recessed region 001. Correspondingly, the second inorganic layer 503 is recessed in the area of the organic layer 502 corresponding to the light-transmitting area ACP, that is, the second inorganic layer 503 is matched with the recessed area 001; at the same time, the color film layer CF is disposed on the surface of the second inorganic layer 503 away from the driving backplane BP. Based on the morphology of the second inorganic layer 503, the color film layer CF is recessed in the area corresponding to the light-transmitting area ACP, so that compared to the area of the color film layer CF corresponding to the main display area AM, the area of the color film layer CF corresponding to the area of the light-transmitting area ACP is closer to the pixel definition layer PDL.

Embodiment 4

Figure 6:
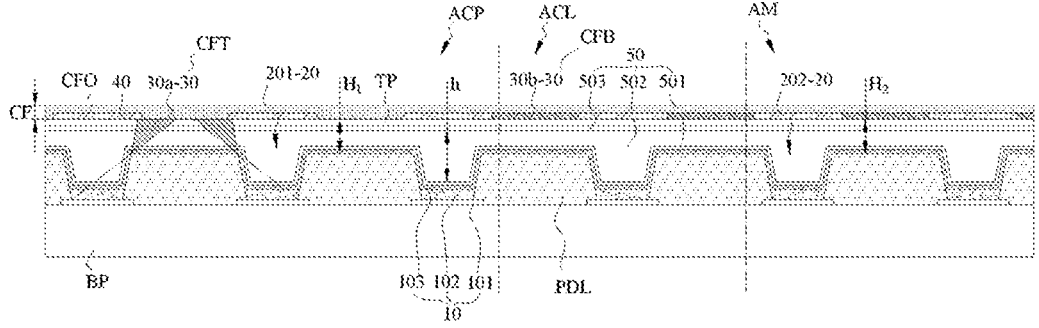
FIG. 6 is a schematic diagram of Embodiment 4 of the display panel of the present disclosure.

As shown in FIG. 6, the thickness h of the organic layer 502 of the encapsulation layer 50 can be set to 6 μm-12 μm, such as 6 μm. Of course, it can also be 7 μm, 8 μm, 9 μm, 10 μm, 11 μm, etc. On the basis of achieving planarization and reducing stress, excessive thickness is avoided, so that the distance H between the color film layer CF and the pixel definition layer PDL can be shortened by reducing the thickness of the encapsulation layer 50, in order to achieve the purpose of avoiding cross-color. At the same time, the thickness of the organic layer 502 corresponding to the light-transmitting area ACP and the thickness of the organic layer 502 corresponding to the main display area AM are the same, so as to ensure the flatness of the organic layer 502, which is beneficial for bonding with the color film layer CF or other film layers that needs to be stacked on the side of the packaging layer 50 away from the driving backplane BP. Therefore, $H_1=H_2$, and it is necessary to set the thickness of the organic layer 502 as a whole.

It should be noted that the first inorganic layer 501 is recessed at the position corresponding to the opening 20, and the recessed area is filled by the organic layer 502. The thickness of the organic layer 502 corresponding to the area of the opening 20 and the thickness of the area of the organic layer 502 corresponding to the area outside the opening 20 are different. The thickness of the organic layer 502 may refer to the thickness h of the organic layer 502 corresponding to the opening 20, or the thickness corresponding to the area outside the opening 20, but in one same embodiment, the meaning of the thickness of the organic layer 502 is the same.

Embodiment 5

Figure 7:
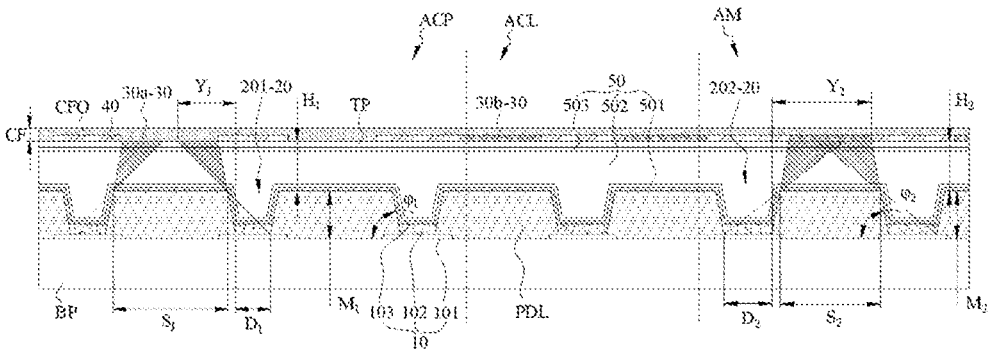
FIG. 7 is a schematic diagram of Embodiment 5 of the display panel of the present disclosure.

As shown in FIG. 7, the maximum width of the orthographic projection of the at least one first opening 201 on the driving backplane BP is smaller than the maximum width of the orthographic projection of the at least one second opening 202 on the driving backplane BP, i.e., $D_1<D_2$. For example, if the first openings 201 have the same size and the second openings 202 have the same size, then the maximum width of the orthographic projection of any first opening 201 on the driving backplane BP is less than the maximum width of the orthographic projection of any second opening 202 on the driving backplane BP; or, if different first openings 201 have different sizes, and different second openings have different sizes, then at least the first opening 201 and the second opening 202 where the light-emitting devices 10 with same light-emitting color is located can satisfy $D_1<D_2$.

At the same time, $\varphi_1=\varphi_2$. If both of the first opening 201 and the second opening 202 are circular, then $D_1$ and $D_2$ are the diameters of the first opening 201 and the second opening 202 respectively; if both of the first opening 201 and the second opening 202 are elliptical, then $D_1$ and $D_2$ are the lengths of the major axis of the first opening 201 and the second opening 202 respectively. Therefore, the purpose of avoiding cross-color can be achieved by making $D_1<D_2$.

Figure 8:
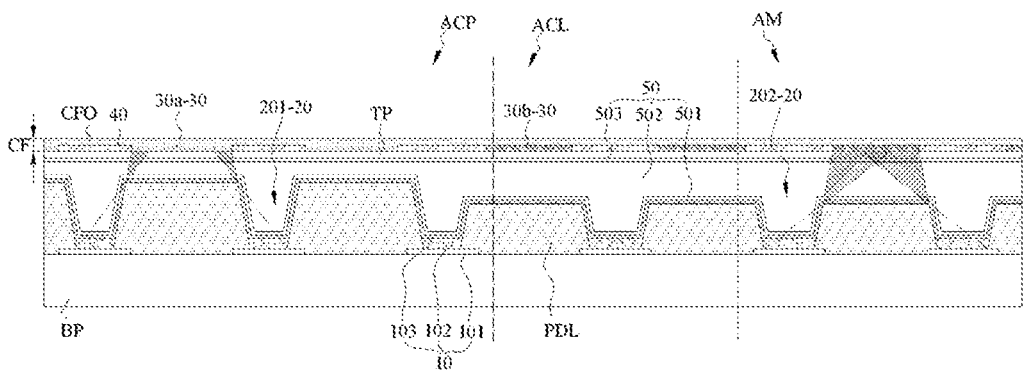
FIG. 8 is a schematic diagram of Embodiment 6 of the display panel of the present disclosure.

In other embodiments of the present disclosure, the schemes in the above-mentioned Embodiments 1 to 3 can be combined, for example:

In the Embodiment 6, as shown in FIG. 8, while $M_1>M_2$, $D_1<D_2$.

In some embodiments, while $M_1>M_2$, the thickness of the organic layer 502 is set to be 6 μm-12 μm. In some embodiments, while $D_1<D_2$, the thickness of the organic layer 502 is set to be 6 μm-12 μm.

In some embodiments, $M_1>M_2$, $D_1<D_2$, and the thickness of the organic layer 502 is set to 6 μm-12 μm. Of course, it is not limited to the embodiments listed above, for example, $\varphi_1<\varphi_2$ can also be used as long as it can be used to realize $S_1\geq2Y_1$.

Figure 9:
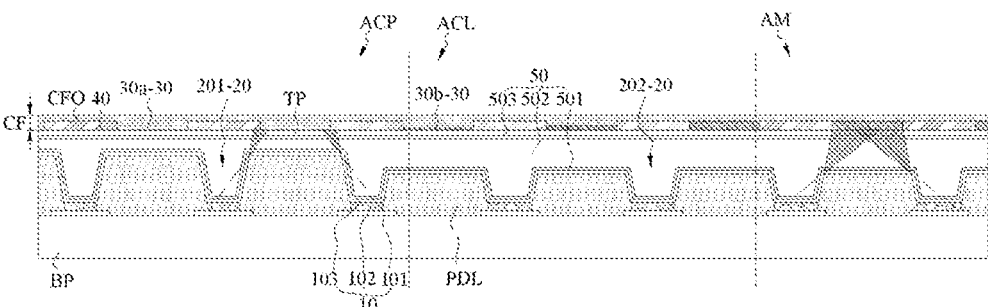
FIG. 9 is a schematic diagram of Embodiment 7 of the display panel of the present disclosure.

Based on the above display panel, the inventors further found that if the light-transmitting display area AC only includes the light-transmitting area ACP, There is a significant difference in the light transmittance between the spacer 30*a* corresponding to the light-transmitting area ACP and the spacer 30*b* corresponding to the main display area AM, resulting in a boundary visible to the naked eye between the two areas, which affects the display effect. Therefore, the inventor proposes the following solutions:

As shown in FIG. 1 and FIG. 9, the light-transmitting display area AC can be further divided, which also includes a transition area ACL surrounding the light-transmitting area ACP; the spacer 30 corresponding to the transition area ACL is a light-shielding structure, and the spacer 30*a* and the spacer portion 30*b* corresponding to the main display area AM may belong to the light-shielding layer CFB, that is, the light-shielding layer CFB may extend to an area in the light-transmitting display area AC corresponding to the area outside the light-transmitting area ACP. At the same time, the thicknesses of spacers 30*b* corresponding to the transition area ACL decrease toward the direction close to the light-transmitting area ACP. For the light-shielding spacer 30*b*, its thickness directly affects its light-shielding effect, and as the thickness decreases, the light-shielding effect weakens, and the thickness of the spacer 30*b* is gradually changed, so that there are spacers 30 with gradually changed light-shielding effect between the transparent spacer 30*a* and the light-shielding spacer 30*b*, which is beneficial to eliminate the visible boundary between the light-transmitting area ACP and the main display area AM, and improve the display effect.

The method for setting the thickness of the spacer 30 will be described in detail below:

Embodiment 7

As shown in FIG. 2, the transition area ACL may include a plurality of sub-areas ACL1 sequentially surrounding the light-transmitting area ACP, and each sub-area ACL1 is an annular area. The width of any sub-area ACL1 along the distribution direction of the sub-areas ACL1 is not less than the distance between two adjacent filter parts 40. The number of sub-areas ACL1 is not particularly limited here.

As shown in FIG. 9, the thicknesses of the spacers 30 corresponding to the same sub-area ACL1 are the same, and the thicknesses of the spacers 30 corresponding to different sub-areas ACL1 decrease towards the direction closing to the light-transmitting area ACP. At the same time, the thickness of the spacer 30 corresponding to the sub-area ACL1 farthest from the light-transmitting area ACP is equal to the thickness of the spacer 30 corresponding to the main display area AM, that is, the thickness of the spacer 30 corresponding to the main display area AM is the maximum thickness of the spacers 30. In addition, due to the error of the manufacturing process, the thicknesses of the spacers 30 may not be uniform, and the thicknesses of different areas may be different. Then, within the range allowed by the error, the spacer corresponding to the sub-area ACL1 farthest from the light-transmitting area ACP The thickness of 30 is approximately equal to the thickness of the spacer 30 corresponding to the main display area AM.

Further, the thicknesses of the spacers 30 in different sub-areas ACL1 decrease uniformly toward the light-transmitting area ACP. For example, the thicknesses may decrease in an arithmetic sequence, so that the light-shielding effect changes uniformly.

The spacers 30 corresponding to the transition area ACL and the main display area AM all belong to the light-shielding layer CFB. Since the light-shielding layer CFB has a plurality of areas with different thicknesses, the light-shielding layer can be formed simultaneously through a gray-scale mask process. In the gray-scale masking process, by adopting a plurality of gray-scale masks with different light transmittances, the spacers 30 with different thicknesses can correspond to areas with different light transmittances of the gray-scale mask, thereby avoiding the formation of spacers 30 with multiple thicknesses respectively, to simplify the process.

Figure 11:
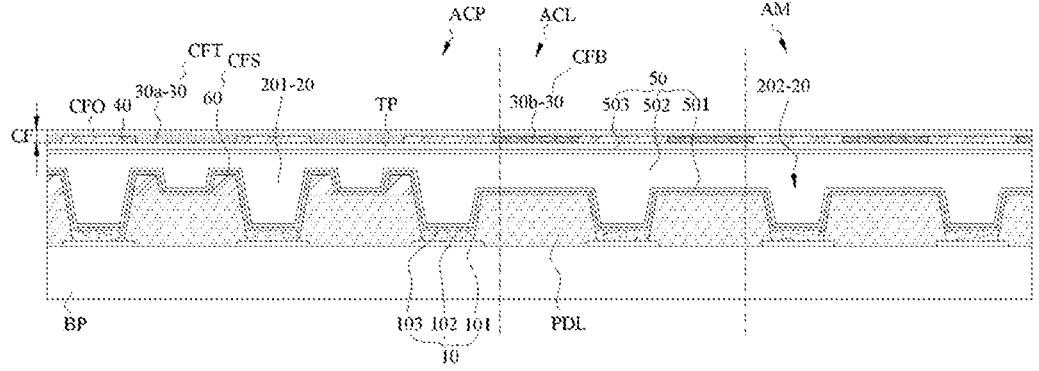
FIG. 11 is a schematic diagram of an auxiliary filter layer in an embodiment of the display panel of the present disclosure.
Figure 12:
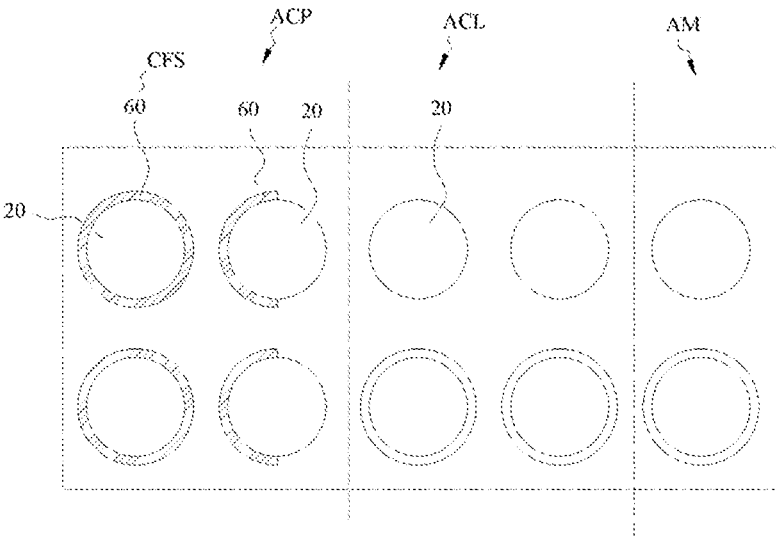
FIG. 12 is a top view of an auxiliary filter layer in an embodiment of the display panel of the present disclosure.

The inventors found that if the boundary of the irradiation range of the light-emitting device 10 is located at the spacer 30 adjacent to the filter part 40 and does not pass through the filter part 40, if the spacer 30 is a light-shielding structure, then the light not filtered by the filter part 40 is difficult to exit, which will not affect the display effect. If the spacer 30 is of transparent structure, then the light not filtered by the filter part 40 will exit from the spacer 30, and such light is different in color coordinates from the light filtered by the filter part 40, resulting in color shift in the image. That is to say, when displaying an image on the light-transmitting area ACP, since the spacer 30a cannot shield the light, the image is prone to color shift, and the color shift is different when viewed from different angles, affecting the overall display effect of the display panel. In order to solve this problem, the inventor proposes the following technical solutions:

As shown in FIG. 11 and FIG. 12, in some embodiments of the present disclosure, the display panel may further include an auxiliary filter layer CFS, which may be provided on the surface of the pixel definition layer PDL away from the driving backplane BP. For example, the auxiliary filter layer CFS may be disposed on the surface of the second inorganic layer 502 away from the driving backplane BP. The auxiliary filter layer CFS is located on the surface of the PDL away from the driving backplane BP and corresponding to the light-transmitting area ACP, that is, the orthographic projection of the auxiliary optical filter layer CFS on the driving backplane BP is located in the light-transmitting area ACP. Meanwhile, the orthographic projection of the auxiliary filter layer CFS on the driving backplane BP may be located outside the orthographic projection of the opening 20 on the driving backplane BP.

The auxiliary filter layer CFS may include a plurality of filters 60, and one filter body 60 may be arranged along an edge of an opening 20 as a barrier around the light-emitting device 10 in the opening 20 it surrounds. At the same time, the color of the light that can pass through any filter body 60 is the same as the light emitting color of the light-emitting device 10 it surrounds, and the light emitted by the light-emitting device 10 toward the spacer 30 needs to pass through the filter body 60 before reaching the spacer 30, thereby reducing the color difference between the light emitted from the spacer 30a of the transparent structure and the light of the same color emitted from the filter part 40, thereby improving the color shift of the light-transmitting area ACP.

Correspondingly, the second electrode can cover the auxiliary filter layer CFS, and can protrude from each filter body 60, and the first inorganic layer 501 can also protrude from each filter body 60.

As shown in FIG. 12, in some embodiments of the present disclosure, if the spacers 30 adjacent to the filter part 40 corresponding to an opening 20 are all transparent structures, the filter bodies 60 extending along the edge of the opening 20 have a ring structure surrounding the opening 20.

If there is a spacer 30a of a transparent structure and a spacer 30b of a light-shielding structure in the spacers 30 adjacent to the filter part 40 corresponding to an opening 20, for example, the opening 20 may be an opening 20 at the junction of the light-transmitting area ACP and the transition area ACDL. Since the spacer 30b is opaque, there is no color shift problem, and the filter body 60 extending along the edge of the opening 20 only exists on the edge of the opening 20 corresponding to the spacer 30a, while the edge corresponding to the spacer 30b can be disconnected, for example, the filter body 60 may be an arc-shaped structure.

It should be noted that the aforementioned ring structure of the filter body 60 may be a continuous closed structure surrounding the opening 20 in any shape such as a circular ring or a square ring. Of course, in other embodiments of the present disclosure, the filter body 60 may also include a plurality of filter units distributed along a circular track around the opening 20 at intervals.

In other embodiments of the present disclosure, each filter body 60 may have a ring structure, so as to simplify the process.

In some embodiments of the present disclosure, in order to further reduce color shift, the material of the filter part 40 corresponding to the same light-emitting device 10 may be the same as the material of the filter body 60 surrounding the light-emitting device 10. Of course, different materials can also be used as long as the colors are the same.

Figure 13:
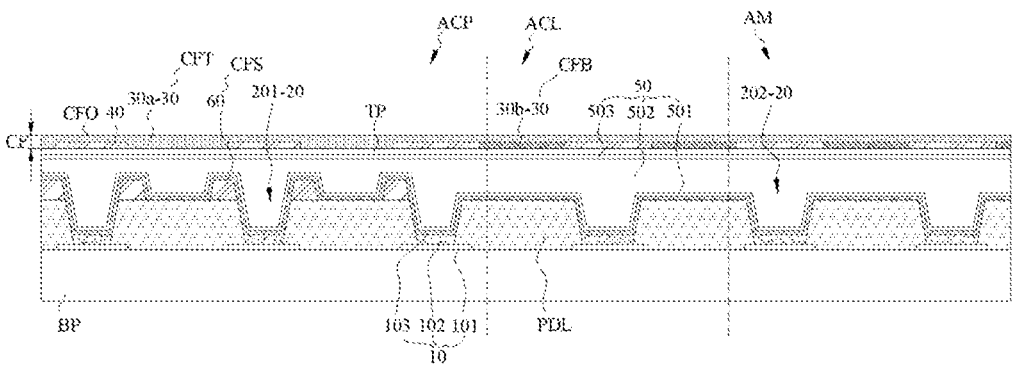
FIG. 13 is a schematic diagram of Embodiment 8 of the display panel of the present disclosure.

The above-mentioned auxiliary filter layer CFS can be applied to any of the above embodiments. For example, as shown in FIG. 13, in the Embodiment 8 of the present disclosure, the auxiliary filter layer CFS can be combined with the Embodiment 5.

Certainly, the auxiliary filter layer CFS may not be combined with any of the above embodiments, but may be applied separately to the display panel.

Embodiments of the present disclosure provide a method for manufacturing a display panel, which is used for manufacturing the display panel in any of the above embodiments, and the specific structure of the display panel will not be described in detail here. The manufacturing method includes step S110 to step S130, wherein:

Step S110, forming a driving backplane with a display area. The display area includes a light-transmitting display area AC and a main display area, and the light-transmitting display area AC includes a light-transmitting area;

Step S120, forming a plurality of light-emitting devices and a pixel definition layer including a plurality of openings on a side of the driving backplane. The openings include a first opening located in the light-transmitting area and a second opening located in the main display area, and the light-emitting devices are defined in the openings in one-to-one correspondence;

Step S130, forming a color film layer on the side of the pixel definition layer away from the driving backplane. The color film layer includes a spacer and a plurality of filter parts separated by the spacer. In the direction perpendicular to the driving the backplane, the area of the spacer corresponding to the light-transmitting area is a transparent structure, and the area of the spacer corresponding to the main display area is a light-shielding structure; the color of the filter part is same as the light-emitting color of light-emitting device in the corresponding opening;

The distance between the edges of two adjacent first openings on the surface of the pixel definition layer away from the driving backplane is the opening interval, and the opening interval satisfies the following relationship:

$$S_1 \geq 2(D_1 H_1/M_1 + H_1/\tan \varphi_1);$$

Wherein, $S_1$ is the opening interval between two adjacent first openings;

$D_1$ is the maximum width of the edge of the light-emitting device in the first opening in a direction parallel to the pixel definition layer;

$M_1$ is the thickness of the area of the pixel definition layer corresponding to the light-transmitting area;

$H_1$ is the distance between the surface of the pixel definition layer corresponding to the light-transmitting area away from the driving backplane and the surface of the color film layer close to the driving backplane;

$\varphi_1$ is the angle between the sidewall of the first opening and the side surface of the driver backplane provided with the pixel definition layer, and $0° < \varphi_1 \leq 90°$.

In some embodiments of the present disclosure, for the display panel in the above Embodiment 1, when forming the pixel definition layer and the support column, pixel definition layers with different thicknesses ($M_1 > M_2$) can be formed by a gray-scale mask process, then support column is formed on the pixel definition layer corresponding to the main display area. Alternatively, the same material can be used to form the support columns and the pixel definition layer, and $M_1 = 2M_2 + N$, and the support column and the pixel definition layer can be formed simultaneously through a gray-scale mask process.

In some embodiments of the present disclosure, for the display panel of the above Embodiment 5, when forming the light-shielding layer of the color film layer, exposure and development can be performed through a gray-scale mask having multiple areas with different light transmittances, thereby obtaining a light-shielding layer having a plurality of spacers with different thicknesses.

It should be noted that although the various steps of the manufacturing method in the present disclosure are described in a specific order in the drawings, this does not require or imply that these steps must be performed in this specific order, or that all shown steps must be performed to achieve the desired result. Additionally or alternatively, certain steps may be omitted, multiple steps may be combined into one step for execution, and/or one step may be decomposed into multiple steps for execution, etc.

The present disclosure also provides a display device, which may include the display panel of any of the above-mentioned embodiments, and its structure and beneficial effects have been described in detail in the above embodiments of the display panel. For the display panel of the display device of the disclosure and the beneficial effects thereof, reference can be made to the above-mentioned embodiments of the display panel, which will not be repeated here.

The present disclosure also provides a terminal device, which may include a display device and an imaging device, wherein:

The display device is a display device in any of the above-mentioned embodiments, and its structure may refer to the above-mentioned embodiments of the display panel and the display device, which will not be repeated here.

The imaging device can be disposed on the side of the driving backplane away from the pixel definition layer, and corresponding to the light-transmitting display area AC, that is, the orthographic projection of the imaging device on the driving backplane at least partially overlaps with the light-transmitting display area AC. At the same time, the imaging device can capture images through the light-transmitting area, and the light-transmitting area can also display images, thereby realizing under display photography. The imaging device may include an imaging device, such as an RGB camera device or other camera devices, and its type is not limited here. The imaging device may also include a plurality of camera devices, and images are captured by the plurality of camera devices simultaneously or in time-division manner.

The terminal device of the present disclosure may be a mobile phone, a tablet computer, and other electronic devices that have an image display function and need to capture images.

Other embodiments of the present disclosure will be readily apparent to those skilled in the art from consideration of the specification and practice of the disclosure herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and embodiments are to be considered exemplary only, with the true scope and spirit of the disclosure indicated by the appended claims.

What is claimed is:

1. A display panel, comprising:

a driving backplane having a display area, the display area comprises a light-transmitting display area and a main display area, and the light-transmitting display area comprises a light-transmitting area;

a pixel definition layer disposed on a side of the driving backplane and comprising a plurality of openings, the openings comprise a first opening located in the light-transmitting area and a second opening located in the main display area;

a plurality of light-emitting devices defined in the openings in one-to-one correspondence, at least two of the light-emitting devices emit light in different colors;

a color film layer disposed on a side of the pixel definition layer away from the driving backplane, and comprising spacers and a plurality of filter parts separated by the spacers; in a direction perpendicular to the driving backplane, the openings are disposed in one-to-one correspondence with the filter parts, a spacer corresponding to the light-transmitting area is of transparent structure, and a spacer corresponding to the main display area is of light-shielding structure; colors of the filter parts are same as light-emitting colors of light-emitting devices in corresponding openings;

a distance between edges of two adjacent openings on a surface of the pixel definition layer away from the driving backplane is an opening interval; the opening interval between two adjacent first openings satisfies the following relationship:

$$S_1 \geq 2(D_1 H_1/M_1 + H_1/\tan \varphi_1);$$

wherein, $S_1$ is the opening interval between the two adjacent first openings;

$D_1$ is a maximum width of an edge of the light-emitting device in the first opening in a direction parallel to the pixel definition layer;

$M_1$ is a thickness of an area of the pixel definition layer corresponding to the light-transmitting area;

$H_1$ is a distance between a surface of the pixel definition layer corresponding to the light-transmitting area away from the driving backplane and a surface of the color film layer close to the driving backplane;

$\varphi_1$ is an angle between a side wall of the first opening and a side surface of the driver backplane provided with the pixel definition layer, and $0°<\varphi_1\leq90°$.

2. The display panel according to claim 1, wherein the light-emitting device comprises:

a first electrode disposed on a same side of the driving backplane as the pixel definition layer, and an edge of the first electrode is covered by the pixel definition layer;

a light-emitting functional layer disposed on a surface of the first electrode away from the driving backplane;

a second electrode covering the light-emitting functional layer;

the maximum width of the edge of the light-emitting device in the first opening in the direction parallel to the pixel definition layer is: a maximum width of an edge of the first opening on a surface of the pixel definition layer close to the driving backplane in the direction parallel to the pixel definition layer.

3. The display panel according to claim 1, wherein a thickness of an area of the pixel definition layer located between the two adjacent first openings is greater than a thickness of an area of the pixel definition layer located between two adjacent second openings.

4. The display panel according to claim 3, wherein the display panel further comprises:

a support column disposed on a surface of the pixel definition layer away from the driving backplane corresponding to an area outside the light-transmitting area.

5. The display panel according to claim 4, wherein the thickness of the area of the pixel definition layer located between two adjacent first openings is approximately equal to a sum of the thickness of the area of the pixel definition layer located between the two adjacent second openings and a thickness of the support column.

6. The display panel according to claim 1, wherein the display panel further comprises:

an encapsulation layer covering the light-emitting devices, a thickness of the encapsulation layer corresponding to the light-transmitting area is smaller than a thickness of the encapsulation layer corresponding to the main display area;

the color film layer is disposed on a surface of the encapsulation layer away from the driving backplane, and is recessed in an area corresponding to the light-transmitting area.

7. The display panel according to claim 6, wherein the encapsulation layer comprises:

a first inorganic layer covering the light-emitting devices;

an organic layer disposed on a surface of the first inorganic layer away from the driving backplane; a thickness of the organic layer corresponding to the light-transmitting area is smaller than a thickness of the organic layer corresponding to the main display area;

a second inorganic layer covering the organic layer and recessed in an area of the organic layer corresponding to the light-transmitting area;

the color film layer is disposed on a surface of the second inorganic layer away from the driving backplane, and is recessed in an area corresponding to the light-transmitting area.

8. The display panel according to claim 1, wherein the display panel further comprises:

a first inorganic layer covering the light-emitting devices;

an organic layer disposed on a surface of the first inorganic layer away from the driving backplane;

a second inorganic layer covering the organic layer;

the color film layer is disposed on a side of the second inorganic layer away from the driving backplane.

9. The display panel according to claim 1, wherein a maximum width of an orthographic projection of at least one of the first openings on the driving backplane is smaller than a maximum width of an orthographic projection of at least one of the second openings on the driving backplane.

10. The display panel according to claim 1, wherein the light-transmitting display area further comprises a transition area surrounding the light-transmitting area; the spacer corresponding to the transition area is of a light-shielding structure, and thicknesses of the spacers corresponding to the transition area decrease towards a direction close to the light-transmitting area.

11. The display panel according to claim 10, wherein the transition area comprises a plurality of sub-areas surrounding the light-transmitting area in sequence, and thicknesses of the spacers corresponding to the same sub-area are same, thicknesses of the spacers corresponding to different sub-areas decrease toward the direction close to the light-transmitting area; a thickness of a spacer corresponding to a sub-area farthest from the light-transmitting area is approximately equal to a thickness of a spacer corresponding to the main display area.

12. The display panel according to claim 1, wherein the color film layer comprises:

a light-shielding layer disposed on a side of the pixel definition layer away from the driving backplane; an orthographic projection of the light-shielding layer on the driving backplane is located outside the light-transmitting area, and the light-shielding layer comprises a plurality of light-shielding spacers distributed at intervals;

a filter layer comprising a plurality of filter parts distributed in an array, and orthographic projections of the filter parts on the driving backplane are at least distributed in the light-transmitting area and the main display area; filter parts corresponding to the main display area are separated by the light-shielding spacers;

a transparent protective layer covering the light-shielding layer and the filter layer, wherein the transparent protective layer fills a transparent spacer between the filter parts corresponding to the light-transmitting area.

13. The display panel according to claim 1, further comprising:

a touch layer disposed between the color film layer and the pixel definition layer, wherein an area of the touch layer corresponding to the light-transmitting area is hollowed out.

14. A method for manufacturing a display panel, comprising:

forming a driving backplane with a display area, the display area comprises a light-transmitting display area and a main display area, and the light-transmitting display area comprises a light-transmitting area;

forming a plurality of light-emitting devices and a pixel definition layer including a plurality of openings on a side of the driving backplane, the openings comprise a first opening located in the light-transmitting area and a second opening located in the main display area, the light-emitting devices are defined in the openings in one-to-one correspondence;

forming a color film layer on a side of the pixel definition layer away from the driving backplane, the color film layer comprises spacers and a plurality of filter parts separated by the spacers; in a direction perpendicular to the driving backplane, an area of the spacer corresponding to the light-transmitting area is of a transparent structure, and an area of the spacer corresponding to the main display area is of a light-shielding structure; a color of the filter part is same as a light-emitting color of an light-emitting device in corresponding opening;

a distance between edges of two adjacent openings on a surface of the pixel definition layer away from the driving backplane is an opening interval; the opening interval between two adjacent first openings satisfies the following relationship:

$$S_1 \geq 2(D_1 H_1 / M_1 + H_1 / \tan \varphi_1);$$

wherein, $S_1$ is the opening interval between the two adjacent first openings;

$D_1$ is a maximum width of an edge of the light-emitting device in the first opening in a direction parallel to the pixel definition layer;

$M_1$ is a thickness of an area of the pixel definition layer corresponding to the light-transmitting area;

$H_1$ is a distance between a surface of the pixel definition layer corresponding to the light-transmitting area away from the driving backplane and a surface of the color film layer close to the driving backplane;

$\varphi_1$ is an angle between a side wall of the first opening and a side surface of the driver backplane provided with the pixel definition layer, and $0° < \varphi_1 \leq 90'$.

15. A display device, comprising the display panel according to claim 1.

16. A terminal device, comprising:

the display device of claim 15;

an imaging device disposed on a side of the driving backplane away from the pixel definition layer, and corresponding to the light-transmitting area, and capable of capturing images through the light-transmitting area.

\* \* \* \* \*